United States Patent [19]
Reinhardt et al.

[11] Patent Number: 5,644,243
[45] Date of Patent: Jul. 1, 1997

[54] DETECTOR POWER LINEARITY REQUIREMENTS AND VERIFICATION TECHNIQUES FOR TMI DIRECT DETECTION RECEIVERS

[75] Inventors: Victor S. Reinhardt, Rancho Palos Verdes; Yi-Chi Shih, Palos Verdes Estate; Paul A. Toth, Cypress; Samuel C. Reynolds, Los Angeles, all of Calif.

[73] Assignee: Hughes Aircraft Company, Los Angeles, Calif.

[21] Appl. No.: 349,348

[22] Filed: Dec. 5, 1994

[51] Int. Cl.⁶ .................................................. G01R 23/20
[52] U.S. Cl. ........................... 324/626; 324/623; 324/633
[58] Field of Search ...................................... 324/612, 620, 324/623, 626, 633, 76.14, 76.19

[56] References Cited

U.S. PATENT DOCUMENTS

| | | | |
|---|---|---|---|
| 3,619,774 | 11/1971 | Landwehr | 324/626 X |
| 3,663,954 | 5/1972 | Alker | 324/620 |
| 3,711,769 | 1/1973 | Peake | 324/612 |
| 4,246,535 | 1/1981 | Huang et al. | 324/612 X |

OTHER PUBLICATIONS

V. S. Reinhardt, et al. *Methods for Measuring the Power Linearity of Microwave Detectors for Radiometric Applications*, (month unavailable) To be published in the 1994 IEEE MTT–S Symposium Digest.

*Primary Examiner*—Kenneth A. Wieder
*Assistant Examiner*—Glenn W. Brown
*Attorney, Agent, or Firm*—Elizabeth E. Leitereg; Terje Gudmestad; Wanda K. Denson-Low

[57] ABSTRACT

A system (36, 98) for determining the linearity of an RF detector (46, 106). A first technique involves combining two RF signals from two stable local oscillators (38, 40) to form a modulated RF signal having a beat frequency, and applying the modulated RF signal to a detector (46) being tested. The output of the detector (46) is applied to a low frequency spectrum analyzer (48) such that a relationship between the power levels of the first and second harmonics generated by the detector (46) of the beat frequency of the modulated RF signal are measured by the spectrum analyzer (48) to determine the linearity of the detector (46). In a second technique, an RF signal from a local oscillator (100) is applied to a detector (106) being tested through a first attenuator (102) and a second attenuator (104). The output voltage of the detector (106) is measured when the first attenuator (102) is set to a particular attenuation value and the second attenuator (104) is switched between first and second attenuation values. Further, the output voltage of the detector (106) is measured when the first attenuator (102) is set to another attenuation value, and the second attenuator (104) is again switched between the first and second attenuation values. A relationship between the voltage outputs determines the linearity of the detector (106).

20 Claims, 3 Drawing Sheets

DETECTOR POWER LINEARITY REQUIREMENTS AND VERIFICATION TECHNIQUES FOR TMI DIRECT DETECTION RECEIVERS

The U.S. government has a paid-up license in this invention and the right in limited circumstances to require the patent owner to license others on reasonable terms as provided for by the terms of contract number NAS5-32018 awarded by NASA.

BACKGROUND OF THE INVENTION

1. Field of the Invention

This invention relates generally to a technique for determining the power linearity of a detector and, more particularly, to a technique for determining the power output linearity for a detector associated with a microwave radiometer.

2. Discussion of the Related Art

Certain detectors, such as microwave radiometers, receive electromagnetic noise radiation from a remote scene, and convert this radiation to a DC voltage representation so as to generate, for example, a temperature gradient image of the scene. Microwave radiometers receive thermal noise radiation from the scene and generate a DC voltage equivalent of the noise at microwave radio frequencies (RF). This principal is possible because, as is well understood, RF thermal noise being radiated from a body is proportional to the temperature of the body. Because the amount of radiation a body will generate is proportional to its temperature, it is necessary that the voltage output of the detector be substantially linear in order to give an accurate characterization of the temperature of the body. A microwave radiometer, therefore, relies on the power linearity of its microwave receivers to accurately measure the remote microwave thermal noise sources. In some applications, rigid accuracy is not necessary, and thus the linearity of the output of the receiver can be more relaxed. However, in other applications, the accuracy is very important, and thus, the output linearity of the receiver is critical.

One application in which receiver output linearity is crucial for generating accurate output data is realized in a tropical rainfall measuring mission (TRMM) microwave imager (TMI). The TMI incorporates a microwave radiometer which relies on the power linearity of its microwave receivers to produce noise temperature scans of the earth at a series of frequency and polarization channels. FIG. 1 shows a block schematic representation of one channel of a receiver 10 associated with a microwave radiometer used in a TMI. The receiver 10 is based on a satellite (not shown) orbiting the earth 12 in a geosynchronous orbit above a predetermined area of the earth 12. Electromagnetic thermal noise radiation 14 from the earth 12 in the microwave frequency range is received by the receiver 10. An earth reflector 16 mounted on the satellite receives the electromagnetic thermal noise radiation 14 and reflects this radiation onto an antenna feed device 18 as indicated by an arrow designated T. The earth reflector 16 is continually rotating about an axis such that a scan line across the earth 12 is generated. As the feed device 18 is rotated, thermal radiation $T_c$ from a cold source 20 and thermal radiation $T_h$ from a hot source 22 are also intermittently applied to the feed device 18. The temperature values $T_c$ and $T_h$ provide known cold and hot thermal noise signals to the receiver 10 for calibration purposes in order to compensate for certain things such as drift in the receiver 10, as is well understood in the art.

The electromagnetic radiation 14 from the earth 12, the cold source 20 and the hot source 22 are applied by the feed device 18 to a low noise amplifier (LNA) 24 in order to provide an amplified receiver thermal noise input signal. The amplified noise signal from the amplifier 24 is then applied to a bandpass filter 26 in order to limit the noise signal to a particular frequency range representative of the particular channel so as to establish a noise or convolution bandwidth. A diode detector 28 receives the bandwidth noise signal from the bandpass filter 26 and generates a DC voltage value indicative of the noise signal. The voltage value is applied to a video amplifier 30 in order to generate an output voltage V that varies with the microwave thermal power noise signal applied to the feed device 18.

FIG. 2 shows a graph of the relationship between the receiver output voltage V at the output of the video amplifier 30 on the vertical axis and the RF thermal noise input signal on the horizontal axis. The point labeled A represents the power input and associated voltage output point of the cold source 20, and the point labeled B represents the power input and associated voltage output point of the hot source 22, where $V_h$ is the hot load voltage output of the receiver 10 when the feed device 18 is directed towards the hot source 22 and $V_c$ is the cold load voltage output of the receiver 10 when the feed device 18 is directed towards the cold source 20. The actual relationship between the output voltage and the input noise signal RF power point for a particular input as the reflector 16 scans the earth 12 will be found along the solid curved line between the points A and B.

The power linearity requirement falls principally on the detector diode 28 used to convert the RF noise signal to a DC voltage. Different diode detectors 28 will have different output curves between points A and B. Therefore, it is not known what the actual output voltage would be for a particular noise input signal received from the scan of the earth 12. Because the output voltage of the detector 28 is nearly linear, the output voltage V for a particular RF noise signal received by the feed device 18 is generally represented by an interpolation algorithm to calculate V along a linear line between the points A and B, as shown by a dotted line, based on the thermal noise radiation input signal. Therefore, an error δV is introduced as a difference between the linear interpolated voltage value and the actual voltage value from the diode detector 28. Consequently, it is sometimes necessary to determine the linearity of the output of the receiver 10 in order to assess whether this linearity is adequate enough for the desired application.

The thermal noise power as applied to the feed device 18 is represented by:

$$P = kB[T + (F-1)T_o], \tag{1}$$

where,

T is the noise temperature of the body being detected;

F is the receiver noise;

B is the receiver convolution (noise) bandwidth;

k is Boltzman's constant; and $T_o$ is 290° K.

By measuring the output voltage V when the antenna feed device 18 is pointed towards the cold source 20, the hot source 22 and the earth 12, $\hat{T}$ can be determined as an estimate of T by using the linear interpolation formula:

$$\hat{T} - T_c = \frac{T_h - T_c}{V_h - V_c} (V - V_c), \quad (2)$$

where, $T_h$ is the temperature of the hot source 22; and $T_c$ is the temperature of the cold source 20.

Typically, the linear interpolation must determine T to a fraction of a degree K out of a system noise temperature of 1000K or more. If δT is defined as the worst case difference between the interpolated temperature $\hat{T}$ and the actual temperature T, it can be shown from FIG. 2 and equation (1) that:

$$\delta T/T_h \cong F \delta P/P_h, \quad (3)$$

where,

δP=kBδT; and $P_h$ is the input power at $T_h$.

This power linearity δP is required over a power range given by:

$$R = P_h/P_c \cong F/(F-1). \quad (4)$$

Table I shows the power linearity requirements for five channels of a known TMI. In Table I, two quantities, δP/$P_h$ and 1+δP/$P_h$, are listed to express the power linearity requirements. The first quantity δP/$P_h$ is useful as a measure of the nonlinear power distortion of the receiver 10. The second quantity 1+δP/$P_h$ is useful as a measure of the power linearity required for the temperature interpolation. Note that a 1+δP/$P_h$ of about 0.001 dB is needed to meet δT requirements.

TABLE I

| Channel Frequency $f_o$ GHz | Temperature Nonlinearity δT K | Noise FIG. F dB | Power Range R dB | Detector Distortion δP/$P_h$ dB | Power Linearity 1 + δP/$P_h$ dB |
|---|---|---|---|---|---|
| 10.65 | 0.275 | 4.03 | 2.19 | −34.26 | 0.0016 |
| 19.35 | 0.390 | 7.99 | 0.75 | −36.70 | 0.0009 |
| 21.3 | 0.445 | 6.61 | 1.07 | −34.75 | 0.0015 |
| 37 | 0.385 | 9.55 | 0.51 | −38.32 | 0.0006 |
| 85.5 | 0.560 | 10.55 | 0.40 | −37.69 | 0.0007 |

Concerns about the power linearity of detectors have led to extensive use of double sideband (DSB) homodyne and single sideband (SSB) heterodyne receivers in previous radiometer designs. In both the DSB homodyne and SSB heterodyne receivers, a local oscillator (LO) is utilized to down convert the noise input signal to an intermediate frequency (IF) before the signal is detected. The principal advantage of these receivers is that the same detector can be utilized for all frequency bands. However, the receiver 10 of FIG. 1 is much simpler than either of the DSB homodyne and SSB heterodyne receiver designs, and thus offers significant cost and complexity advantages. The principal disadvantage, however, of the receiver 10 is that the detector 28 must operate at the input RF frequency, so a different diode detector 28 must be used for each frequency band.

Because of the simplicity of the receiver 10, it is desirable to be utilized as much as possible in radiometer receivers. This principally depends on finding suitable linear RF detectors at each of the desired frequency ranges and on developing simple low-cost methods for verifying the power linearity of RF detectors. What is needed then is a low cost and simple technique for verifying the power linearity of RF detectors. It is therefore an object of the present invention to provide such a technique.

SUMMARY OF THE INVENTION

In accordance with the teaching of the present invention, techniques for verifying the power linearity of RF detectors are disclosed. In a two-tone method, according to one embodiment of the present invention, first and second local oscillators generate stable frequencies that are combined to provide a modulated RF signal that is applied to a detector being tested for linearity. The frequencies of the oscillators are slightly different so that the frequency difference provides a modulated beat frequency. The output signal of the detector is applied to a spectrum analyzer in order to measure the first and second harmonics of the output signal caused by the beat frequency. If the detector was perfectly linear, then no harmonics would exist at the beat frequency. A relationship between the power level of the first and second harmonics provides a value that is indicative of the linearity of the detector. In an alternate embodiment to the two-tone method, the beat frequency is generated by an audio oscillator and is combined with another RF signal so as to enable use of a modulated RF signal that does not have to be as stable as with the original two-tone method.

Another technique for determining the linearity of a detector, according to another embodiment of the present invention, is referred to as a constant ratio method. In the constant ratio method, an RF signal is applied to a detector under test, and an output voltage signal from the detector is measured by a voltmeter. The voltmeter measures the output signal when the RF input signal is nonattenuated. Then, a first attenuator attenuates the RF signal applied to the detector at a first attenuation level. While the first attenuator is at the first attenuation level, the output of the detector is measured when a second attenuator is nonattenuating and is attenuated at a second attenuation level. Then, the first attenuator is set to a third attenuation level, and the output of the detector is again measured when the second attenuator is nonattenuating and is set to the second attenuation level. A relationship between the measured voltages at the different attenuation levels determines the linearity of the detector.

Additional objects, advantages, and features of the present invention will become apparent from the following description and appended claims, taken in conjunction with the accompanying drawings.

DETAILED DESCRIPTION OF THE PREFERRED EMBODIMENTS

Figure 1:
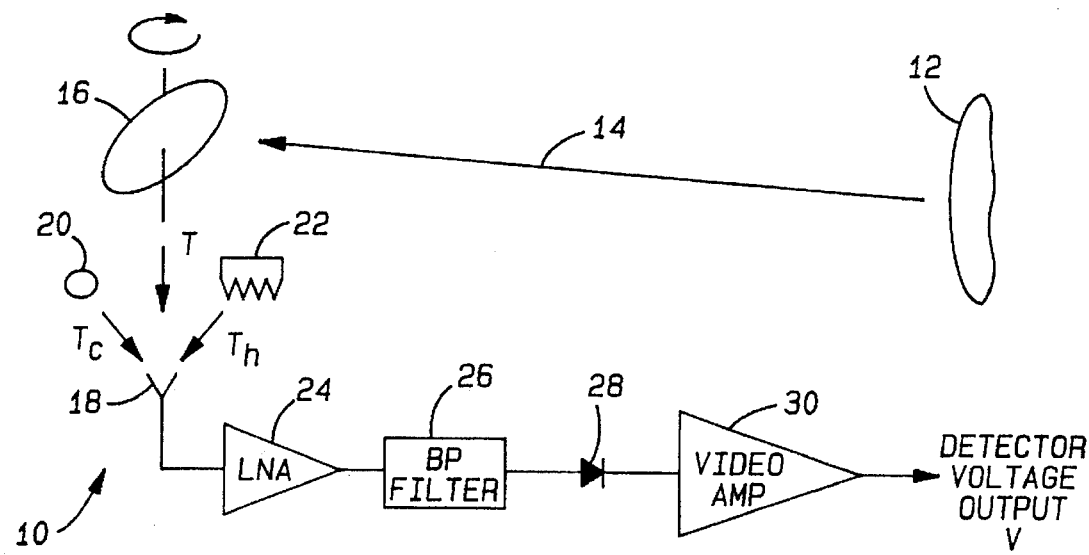
FIG. 1 is a prior art schematic block diagram of a receiver being used in a microwave radiometer for a tropical rain fall measuring mission microwave imager.
Figure 2:
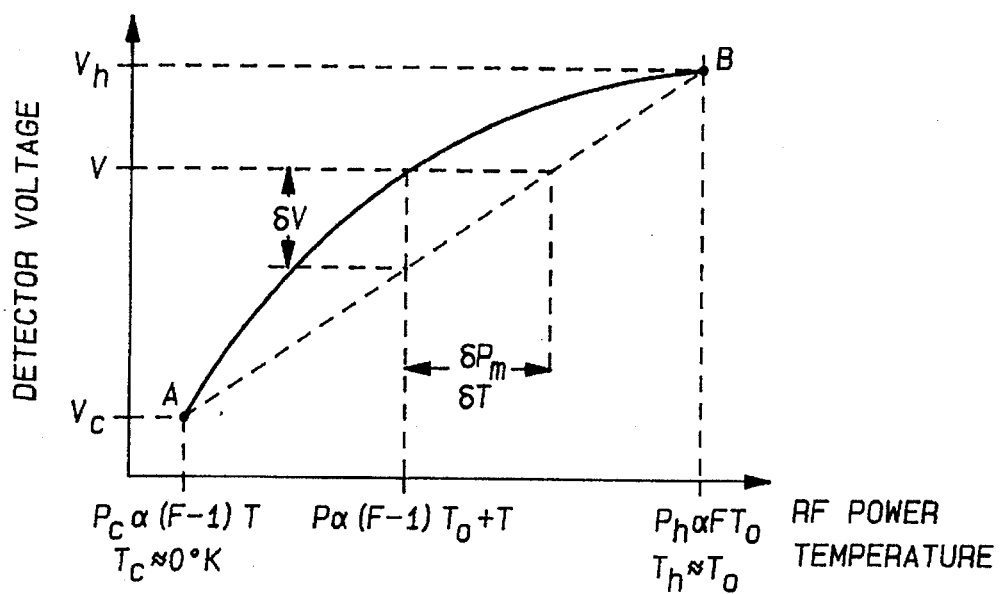
FIG. 2 is a graph of output detector voltage V on the vertical axis and RF power input signals and temperature on the horizontal axis for the receiver of FIG. 1.

The following discussion of the preferred embodiments concerning techniques for determining detector linearity are merely exemplary in nature and are in no way intended to limit the invention or its applications or uses.

In order to generate a technique for determining linearity of a detector, it is first necessary to develop formulas for characterizing the nonlinear temperature error in terms of the RF properties of the receiver 10. To simplify later discussions, Equation (1) may be written in terms of normalized noise temperature variables as:

$$P = X + (F-1)X_o = X + X_r \quad (5)$$

where, $$X = kBT; \quad (6)$$

$$X_o = kBT_o; \text{ and} \quad (7)$$

$$X_r = (F-1)X_o. \quad (8)$$

Note that the normalized temperature X has units of power. The voltage output V of the receiver 10 is given by:

$$V = K_d P + \delta V(P) + V_o. \quad (9)$$

where, $K_d$ is the receiver voltage to power sensitivity;

$\delta V$ is the video voltage power nonlinearity; and $V_o$ is the detector voltage offset.

By rewriting equation (9) in terms of a normalized detector output given by:

$$Y = (V - V_o)/K_d, \quad (10)$$

it can be shown that:

$$Y(P) = P + \delta Y(P), \quad (11)$$

where $\delta Y$ is the normalized receiver nonlinearity. Note that Y has units of power also. Combining equations (5) and (11) gives:

$$Y = Y + X_r + \delta Y. \quad (12)$$

Ignoring the nonlinearity in equation (12), it can be shown that the following linear interpolation formula can be calculated for the temperature $X_m$:

$$X_m - X_c = (Y - Y_c)\Delta X_{hc}/\Delta Y_{hc}, \quad (13)$$

where, $$\Delta X_{hc} = X_h - X_c; \text{ and} \quad (14)$$

$$\Delta Y_{hc} = Y_h - Y_c. \quad (15)$$

Note that $\Delta X_{hc}/\Delta Y_{hc}$ is explicitly included in equation (13) because it will not be unity when $\delta Y$ is not zero.

The radiometer error due to second order nonlinearity is determined by generating a power series expansion of the receiver output. Using a Wiener-Volterra analysis, known to those skilled in the art, and assuming that the bandwidth of a non-linear radiometer is much larger than linear filters in the receiver 10, one can show that the output of the receiver 10 can be written in terms of the input RF voltage $V_r$ as:

$$Y = \Sigma_n Y_n, \quad (16)$$

where, $$Y_n = A_n <<V_r^n>>_T. \quad (17)$$

In this calculation, $<<\ldots>>_T$ represents both an outer time average $<\ldots>_T$ over a finite but long time T, and an inner ensemble average $<\ldots>$. Note that $\Sigma_n$ is used to indicate the sum over n instead of the standard notation to simplify formatting. The time T is considered long enough to eliminate RF signals from the output Y, but not so long as to eliminate lower frequency components from Y. A more precise definition of the length of T will be given below. A double average is utilized in equation (17) so the single variable Y can be used for both random inputs, which requires the use of the ensemble average $<\ldots>$, and coherent inputs, which requires the use of the finite time average $<\ldots>_T$.

Since the receiver 10 is meant to act as a linear power (square law) detector, the first term is assumed to be the $A_2$ term. Because the average power is given by:

$$P = <<V_r^2>>_T, \quad (18)$$

$A_2$ is one by comparison with equation (11). It is also assumed that the symmetry of the RF voltage is such that only $Y_n$ terms with even powers of $V_r$ (even n terms) are non-zero.

The receiver output for bandlimited noise can also be determined. When the RF input is bandlimited white noise, $V_r$ can be represented by:

$$V_r(t) = \int h(t-t')f(t')dt', \quad (19)$$

where, h(t) is the impulse response of the RF bandpass filter; and f(t) is a random Langevin function whose autocorrelation function is given by:

$$<f(t)f(t')> = (N_o/2)\delta(t-t'). \quad (20)$$

The first nonzero term in equation (16) is given by:

$$Y_2 = P = <<V_r(t)^2>>_T = <\int h(t-t')h(t-t'')<f(t')f(t'')>dt'dt''>_T. \quad (21)$$

By using equations (19) and (20), Equation (21) becomes:

$$Y_2 = P = N_o B, \quad (22)$$

where B is the convolution (or noise) bandwidth of the RF filter 26 as given by:

$$B = (1/2)\int h(t)^2 dt, \quad (23)$$

and where it is assumed that $BT \gg 1$. For this random case, note that only the properties of the ensemble average $<\ldots>$ are utilized and that the additional finite time average has no effect on the result.

Comparing this with equation (1) yields:

$$N_o = k[T + (F-1)T_o]. \tag{24}$$

Thus, $N_o$ is the thermal noise power density per unit bandwidth. The second non-zero term in equation (16) is given by:

$$Y_4 = A_4 <<V_r(t)^4>>_T = <A_4 \int h(t-t_1) \ldots h(t-t_4) <f(t_1)f(y_2)f(t_3)f(t_4)> dt \ldots dt_4>_T. \tag{25}$$

Since $<f(t_1)f(t_2)f(t_3)f(t_4)>$ is a fourth order correlation function for uncorrelated white noise, it is non-vanishing only when any two pairs of the time arguments $t_1 \ldots t_4$ are equal. Thus, it can be shown that:

$$<f(t_1)f(t_2)f(t_3)f(t_4)> = (N_o/2)^2[\delta(t_1-t_2)\delta(t_3-t_4) + \delta(t_1-t_3)\delta(t_2-t_4) + \delta(t_1-t_4)\delta(t_2-t_3)], \tag{26}$$

and equation (25) becomes:

$$Y_4 = 3A_4(N_oB_2)^2 = 3A_4P^2. \tag{27}$$

Therefore, to the fourth order, the output of the receiver 10 in the presence of thermal noise is given by:

$$Y = P + 3A_4P^2. \tag{28}$$

The interpolation error due to second order power non-linearity can also be determined. Inserting equation (5) into equation (28) gives:

$$Y = c + bX + 3A_4X^2. \tag{29}$$

where, $$c = X_r + 3A_4X_r^2; \text{ and} \tag{30}$$

$$b = 1 + 6A_4X_r. \tag{31}$$

Using equation (29) at the cold and hot calibration points A and B, $\Delta Y_{hc}$ becomes:

$$\Delta Y_{hc} = \Delta X_{hc}[b + 3A_4(X_h + X_c)], \tag{32}$$

and equation (13) becomes:

$$X_m = X_c + (X - X_c)[b + 3A_4(X + X_c)]/[b + 3A_4(X_h + X_c)]. \tag{33}$$

Thus, the temperature error due to a second order power nonlinearity is given by:

$$X - X_m = 3A_4(X - X_c)(X_h - X)/[b + 3A_4(X_h + X_c)]. \tag{34}$$

The worst case error occurs at:

$$X_m = (X_c + X_h)/2, \tag{35}$$

and is given by:

$$\delta X_m = (3A_4/4)(X_h - X_c)^2/[1 + 3A_4(2X_r + X_h + X_c)], \tag{36}$$

Assuming $A_4 << 1$ and $X_c \cong 0$, equation (36) becomes:

$$\delta X_m/X_h = \delta T_m/T_h \cong (3/4)A_4(X_h - X_c) = (3/4)A_4kBT_h. \tag{37}$$

Equation (36) can also be written as:

$$\delta T_m/T_h \cong (3/4)A_4(P_h - P_c) = (3/4)A_4P_h/F, \tag{38}$$

as a result of equation (4) and the fact that $X_h - X_c = P_h - P_c$.

Figure 3:
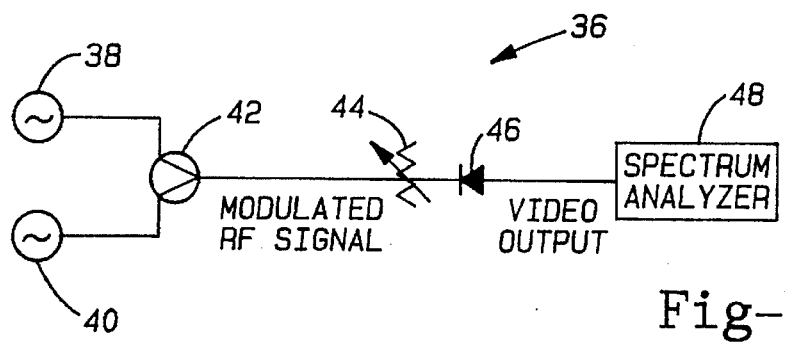
FIG. 3 is a schematic block diagram of a two-tone technique for measuring detector linearity according to a preferred embodiment of the present invention.

From the above calculations, a two-tone method for measuring detector linearity can be developed. FIG. 3 shows a system 36 depicting a two-tone technique for measuring detector linearity according to a preferred embodiment of the present invention. A first local oscillator (LO) 38 generates a frequency $f_o$ and a second local oscillator 40 generates a frequency $f_o + f_m$ where the two frequencies from the oscillators 38 and 40 are substantially equal. The frequency $f_o$ is determined as the frequency at or about the frequencies which a detector being tested will be detecting when in use. For example, for a microwave radiometer, the value of $f_o$ will be on the order of 5–100 GHz. The frequency $f_m$ will be a beat frequency, for example 50 kHz. The frequency signals from the oscillator 38 and 40 are added together by a summing device 42 to generate a stable amplitude modulated RF voltage signal $V_{RF}$ modulated at the beat frequency $f_m$ as represented by:

$$V_{RF} = P_o^{0.5}[\cos(\omega_o t) + \cos((\omega_m + \omega_o)t)], \tag{39}$$

where, $P_o$ is the average RF power;

$\omega_o$ is the lower angular RF frequency; and $\omega_m$ is the angular difference frequency.

This produces an RF signal whose power P is represented by:

$$P = <<V_{RF}^2>>_T = P_o[1 + \cos(\omega_m t)]. \tag{40}$$

It is assumed that $\omega_o >> T^{-1}\omega_m$, so that the RF components are eliminated by the averaging process $<< \ldots >>_T$, but not the low frequency modulation components. For this coherent case, note that only the properties of the time average $< \ldots >_T$ are utilized, and that the additional ensemble average has no effect on the result.

The modulated RF voltage signal $V_{RF}$ is applied to an attenuator 44 in order to adjust the magnitude of this signal for reasons that will become apparent from the discussion below. The voltage signal $V_{RF}$ is then applied to a detector 46 that is being tested for linearity. In this example, the detector 46 is shown as a diode detector. However, it will be understood that the detector 46 can be any detector that produces a DC output voltage proportional to an RF power input. A proportionate DC voltage output signal V from the detector 46 is then applied to a spectrum analyzer 48 to generate a frequency spectrum of the DC signal.

If the detector 46 was an ideal square law (power linear) detector, i.e., one whose video output is exactly proportional to $<V_{RF}^2>$, the spectrum analyzer 48 would only display a frequency component at $\omega_m$, i.e., no harmonics. Therefore, the presence of frequency components at multiples of $\omega_m$ would indicate deviations from square law detector behavior in the detector 46. Therefore, to determine the linearity of the detector 46, the beat frequency harmonics are measured by the analyzer 48. In order to determine the harmonics of the output signal V, the output signal V is first represented by:

$$V = \sum_{k}^{\infty} B_k \cos(k\omega_m t), \tag{41}$$

where, k is a positive integer; and $\Sigma_k$ is used to indicate the sum over the index k.

By rewriting equation (16) as:

$$V = \sum_{n=k}^{\infty} P_o^n A_{2n}(<<V_r^{2n}>>_T/P_o^n), \tag{42}$$

and assuming that only the 2n terms are nonzero, it can be shown that:

$$B_k = \sum_{n=k}^{\infty} P_o^n A_{2n} B_{kn}, \quad (43)$$

where the coefficients $B_{kn}$ are given by the expansion formula:

$$[\cos(\omega_{ot}) + (\cos(\omega_m + \omega_o)t]^{2n} = \sum_{k=0}^{n} b_{kn}\cos(k\omega_m t). \quad (44)$$

The first few coefficients $B_k$ from equation (43) are shown in Table II below.

TABLE II

|       | k = 0   | k = 1 | k = 2 | k = 3 | k = 4 |
|-------|---------|-------|-------|-------|-------|
| n = 1 | 1       | 1     | 0     | 0     | 0     |
| n = 2 | 9/4     | 3     | 3/4   | 0     | 0     |
| n = 3 | 25/4    | 75/8  | 15/8  | 5/8   | 0     |
| n = 4 | 1225/64 | 245/8 | 245/8 | 35/8  | 35/64 |

Thus, the first and second harmonics $B_1$ and $B_2$ are given by:

$$B_1 = P_o + 3A_4 P_o^2, \text{ and} \quad (45)$$

$$B_2 = (3/4)A_4 P_o^2, \quad (46)$$

and for $A_4 P_o \ll 1$, the ratio of the coefficients $B_1$ and $B_2$ is given by:

$$B_2/B_1 = (3/4)A_4 P_o. \quad (47)$$

By the above analysis, it can be seen that by generating a video spectrum of the output of the detector 46, and then measuring the power output of the first and second harmonics, a ratio value can be determined that gives a linearity factor for the detector 46 to determine whether this factor coincides with the acceptable linearity factor for a particular use.

Figure 4:
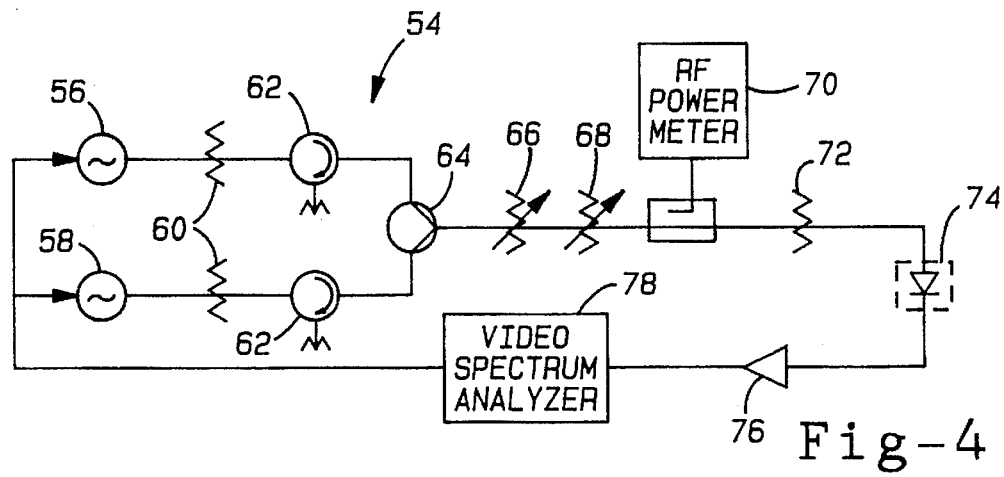
FIG. 4 is a detailed schematic block diagram of a two-tone technique for measuring detector linearity according to a preferred embodiment of the present invention.
Figure 5:
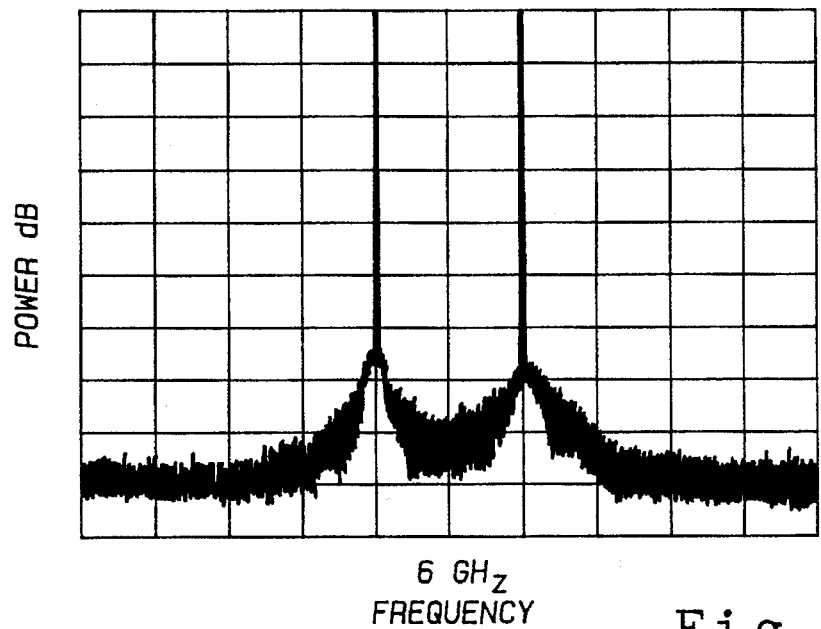
FIG. 5 is a plot of the frequency spectrum of a modulated RF signal being applied to a detector under test in the two-tone technique of FIG. 4.

FIG. 4 shows a block diagram schematic view of a more detailed system 54 setting out the two-tone technique discussed above. In this example, a detector under test will be tested for linearity at 6 GHz. A local oscillator 56 generates a stable oscillation frequency at 6 GHz. A local oscillator 60 generates a stable oscillation frequency at 50 kHz above 6 GHz. A set of attenuators 60 and a set of isolators 62 provide isolation to prevent the generation of intermodulation products from the outputs of the oscillators 56 and 58 that would effect the stable modulation frequency. The frequencies from the oscillators 56 and 58 are summed together by a frequency summing device 64 in order to generate an amplitude modulated RF signal. FIG. 5 shows a graph of the modulated RF signal from the summing device 64. The horizontal axis is the frequency and the vertical axis is the magnitude in dBm of the RF signal. Each vertical line represents 50 kHz, where the center line is 6 GHz. As is apparent there are two spikes representing the beat frequency, at 6 GHz±50 kHz.

A 0-11 dB attenuator 66 and a 0-7 dB attenuator 68 attenuate the modulated RF signal in order to set the amplitude of the signal. An RF power meter 70 measures the power of the attenuated modulated signal such that the RF signal can be accurately set to a desired power value by the attenuators 66 and 68. The signal is then attenuated by a 3 dB attenuator 72 before being applied to a detector 74 being tested. The attenuator 72 provides isolation for the detector 74. The output signal from the detector 74 is applied to a video amplifier 76 to be amplified, and then to a low frequency video spectrum analyzer 78 in order to generate a frequency spectrum of the DC output signal from the detector 74. A 10 MHz frequency reference signal is applied from the video spectrum analyzer 78 to the oscillators 56 and 58 in order to provide a stable reference signal that the oscillators 56 and 58 can lock onto, and thus reduce drift. The spectrum analyzer 78 will display the harmonics of the beat frequency $f_m$, and will also provide a power level for each harmonic.

Figure 6:
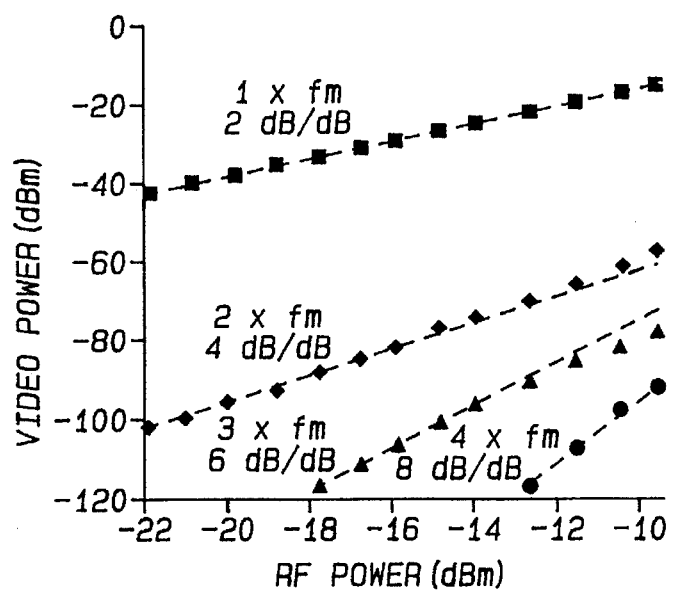
FIG. 6 is a plot of video power and peak RF power of the detector under test for the two-tone technique of FIG. 4.

FIG. 6 shows a plot of the measured harmonics of the output of the detector 74 as a function of the RF power applied to the detector 74. The video power as measured by the spectrum analyzer 78 is on the vertical axis and the RF power input as measured by the RF power meter 70 is on the horizontal axis. The top output line is the first harmonic, the second output line from the top is the second harmonic, the third output line from the top is the third harmonic, and the fourth output line from the top is the fourth harmonic. If the attenuators 66 and 68 are set such that the RF power as measured by the power meter 70 is 20 dBm, the video power of the first, second, third and fourth harmonics are measured by the spectrum analyzer 78 and represented by the square, diamond, triangle and circle data points, respectively, at that power level. The attenuators 66 and 68 are then adjusted to a next power level setting, such as 18 dBm. The power level of the first, second, third and fourth harmonics are again measured at this input RF power level, and this process is continued until the output lines as shown in FIG. 6 are generated. For the first and second harmonics, each data point represents a $B_1$ and $B_2$, respectively, that can be used to determine the ratio $B_2/B_1$ in order to determine the linearity of the detector 74 as discussed above. A series of $B_1$ and $B_2$ values are measured in order to get an overall average of the ratio $B_2/B_1$ so as to generate an accurate ratio since all of the harmonics will vary with power.

Figure 7:
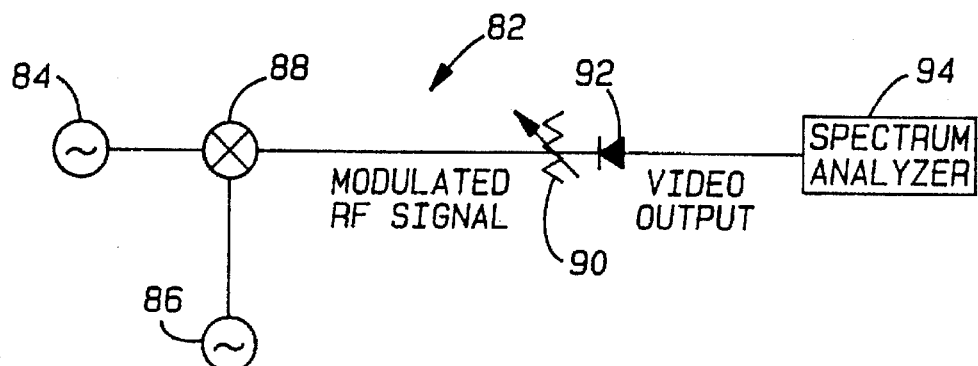
FIG. 7 is a schematic block diagram of an AM modulation technique for measuring detector linearity according to a preferred embodiment of the present invention.

If two local oscillators are not available, an AM modulation technique can be used to measure detector power linearity in a similar manner to the two-tone technique of FIGS. 3 and 4, as shown by an amplitude modulation system 82 in FIG. 7. A carrier local oscillator 84 generates a single carrier frequency at $f_o$ and an audio oscillator 86 generates a beat frequency at $f_m$. A linear modulator 88 modulates the carrier frequency $f_o$ and the beat frequency $f_m$ in order to produce an amplitude modulated RF signal $V_{RF}$ that is again represented by:

$$V_{RF} = P_o^{0.5}(1 + \cos(\omega_m t))\cos(\omega_o t). \quad (48)$$

The modulated RF signal $V_{RF}$ is applied to an attenuator 90 to provide a particular power level of the signal, and then to a detector 92 being tested. As with the system 36 above, the output of the detector 92 is applied to a low frequency spectrum analyzer 94 in order to generate an output frequency spectrum. The spectrum analyzer 94 will generate a series of harmonics of the RF input signal applied to the detector 92. The power level of each harmonic is measured, and the ratio of the power level of the second harmonic to the first harmonic ($B_2/B_1$) is determined to determine the linearity of the detector 92 as with the two-tone technique above.

The system 82 is similar to the two-tone system 36 of FIG. 3 except that a linear power detector generates first and second harmonics at the detector output, and the detector nonlinearities generate correspondingly higher harmonics. Further, because the beat frequency is supplied by a separate audio oscillator 86, the carrier frequency $f_o$ does not have to be stable, and thus, the stability of the local oscillator 84 can be somewhat sloppy. Although the analysis of the harmonics is similar to the two-tone technique, the values of $B_k$ are different as shown in Table III.

TABLE III

|       | k = 1 | k = 2 | k = 3 | k = 4 |
|-------|-------|-------|-------|-------|
| n = 1 | 2     | 1/2   | 0     | 0     |
| n = 2 | 7     | 7/2   | 1     | 1/8   |

The AM modulation system 82 is simpler to implement than the two-tone system 36, but is limited in resolution by the linearity of the modulator 88. Typically, double balanced modulators can achieve higher order tone suppression of only 40 to 50 dB, limiting the ability to measure the higher order tone generation to that level. The two-tone technique is capable of much higher resolutions.

Figure 8:
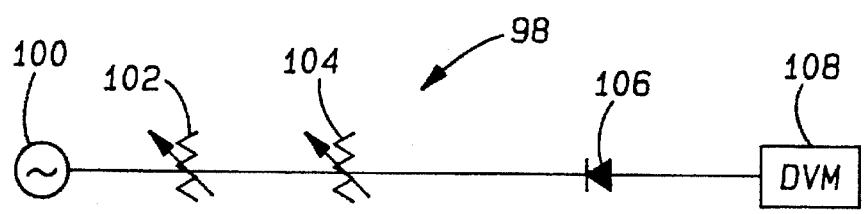
FIG. 8 is a schematic block diagram of a constant ratio technique for measuring detector linearity according to a preferred embodiment of the present invention.

Another embodiment for determining detector linearity is referred to as a constant ratio method. A system 98 implementing the constant ratio technique according to a preferred embodiment of the invention is shown in FIG. 8. The system 98 includes a local oscillator 100 for providing an RF input signal. The RF input signal from the oscillator 100 is attenuated by a first attenuator 102 and then by a second attenuator 104, as shown. The attenuated signal from the second attenuator 104 is then applied to a detector 106 being tested for linearity. The output signal of the detector 106 is then applied to a voltage meter, such as a digital voltmeter 108, to measure the output voltage V of the detector 106.

The constant ratio method is based on the theory that the output linearity of a detector can be determined by the relationship of a set of output voltages of the detector at one attenuation with the relationship of a set of output voltages of the detector at another attenuation regardless of the actual output voltages themselves. In other words, by looking at the slope of a voltage output line of the detector 106 at two power settings, and then comparing these slopes, one can determine the linearity of the output of the detector 106. In the constant ratio, the power output level of the oscillator 100 is set by the attenuator 102 to a value $P_k$, and then the second attenuator 104 is used to change the value $P_k$ by an unspecified but constant ratio Q.

If $Y_1(P_k)$ is the normalized detector output before the attenuation Q, and $Y_2(QP_k)$ is the normalized detector output V after the attenuation Q (assume 0<Q<1), for a linear power detector, a ratio $D_k$ of these detector outputs is given by:

$$D_k = Y_1(P_k)/Y_2(QP_k), \quad (49)$$

and is a constant $Q^{-1}$. Thus, if one varies $P_k$ changes in $D_k$ reflect the power nonlinearity level of the detector 106. Letting $D_1 = D(P_1)$ and $D_2 = D(P_2)$, the following can be shown:

$$M = D_1/D_2 - 1, \quad (50)$$

as a measure of the nonlinearity. Note that Q=0 when no power nonlinearities are present.

The input RF signal from the oscillator 106 is represented by:

$$V_{RF} = (2P)^{0.5} \cos(\omega_o t). \quad (51)$$

Inserting equation (51) into equation (16) and keeping only the $A_2$ and $A_4$ terms, yields a normalized detector output given by:

$$Y = P_o + (3/2) A_4 P_o^2. \quad (52)$$

Utilizing equations (52) and (50) in equation (51) and assuming $A_4$ is small, it can be shown that M becomes:

$$M \cong (3/2) A_4 (1-Q)(P_1-P_2). \quad (53)$$

It can further be shown that the signal-to-error ratio for measuring M is optimized when Q≅0.5 and $P_2 \cong 0.5 P_1$. Using these values and setting $P_1 = P_h$, it can be shown that:

$$M \cong (3/8) A_4 P_h. \quad (54)$$

Thus by utilizing equation (53) or equation (54), the nonlinearity coefficient $A_4$ can be identified and used to determine the linearity of the detector 106.

Figure 9:
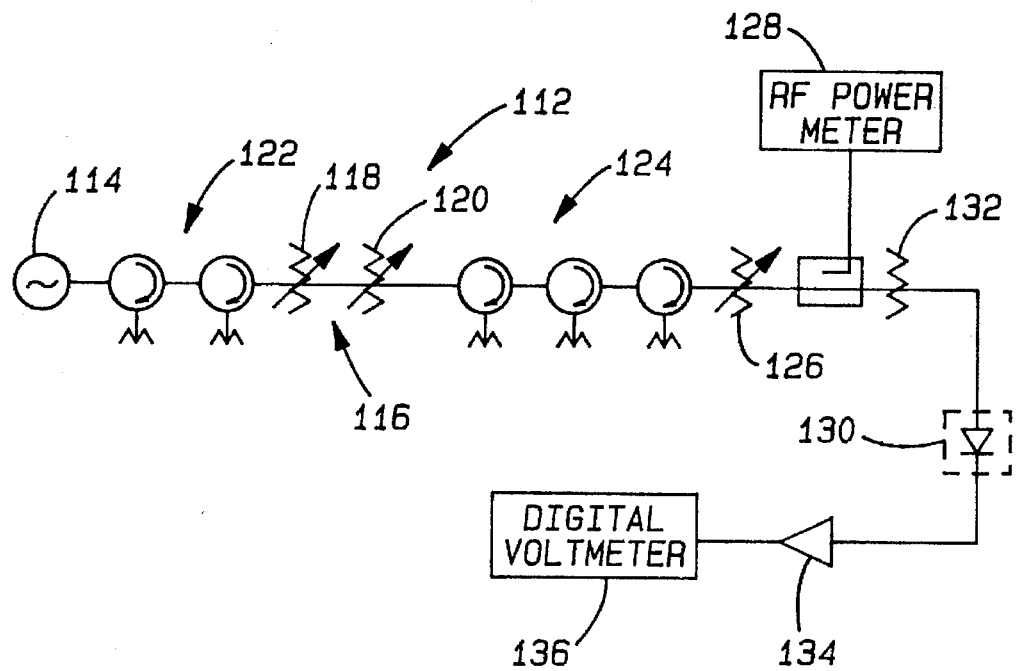
FIG. 9 is a detailed schematic block diagram of a constant ratio technique for measuring detector linearity according to a preferred embodiment of the present invention.

FIG. 9 shows a more detailed schematic block diagram for the implementation of the constant ratio technique as shown by a system 112. A local oscillator 114 generates an RF signal. The RF signal from the oscillator 114 is applied to a set of attenuators 116 in which a first attenuator 118 of the set of attenuators 116 is a 0-70 dB attenuator and a second attenuator 120 of the set of attenuators 116 is a 0-11 dB attenuator. The set of attenuators 116 represents the attenuator 104 of the system 98 above. As is apparent, the set of attenuators 116 is isolated from the oscillator 114 by a set of isolators 122 and is isolated at its output side by a set of isolators 124 in order to reduce the affects of noise and intermodulation products on the attenuators 116. The RF signal from the local oscillator 114 is applied from the set of attenuators 116 to an attenuator 126. The attenuator 126 is representative of the attenuator 102 of the system 98 above. The output RF signal from the attenuator 126 is applied to an RF power meter 128 in order to establish an accurate power level of the RF signal. The RF signal from the attenuator 126 is then applied to a detector 130 under test. An attenuator 132 isolates the detector 130 as with the system 54 above. The DC output voltage from the detector 130, representative of the RF signal, is applied to a video amplifier 134 to be amplified, and then to a digital voltmeter 136 to measure the DC output voltage.

In operation of the system 112, the local oscillator 114 is set to an RF power signal, such as 6 GHz. First, the output voltage of the detector 130 is measured without any attenuation from the set of attenuators 116 and the attenuator 126 as a value $V_0$. The attenuator 126 is then set to a particular attenuation level, such as 6 dB, and the output voltage of the detector 130 is measured as $V_2$. The set of attenuators 116 is then set to a particular attenuation level, such as 3 dB, while the attenuator 126 is still set to 6 dB, and the output voltage of the detector 130 is measured as $V_1$. From the values $V_0$, $V_1$ and $V_2$, $D_1$ is determined from equation (49). Next, the attenuation of the attenuator 126 is set to another value, such as 9 dB, and the output voltage of the detector 130 is measured when the set of attenuators 116 is again set at 0 dB and is set at 3 dB to again determine $V_1$ and $V_2$. From the second measurements of $V_1$ and $V_2$, the coefficient $D_2$ is determined from equation (49). Then, a value M is calculated from $D_1$ and $D_2$ and equation (50) and the nonlinearity of the detector 130 is determined from M using equation (54).

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A system for testing the linearity of a detector that produces a DC output voltage proportional to an RF power input signal, said system comprising:

a fast oscillator that generates a first frequency;

a second oscillator that generates a second frequency;

combining means for combining the first frequency with the second frequency so as to generate a modulated RF signal;

means for applying the modulated RF signal to the detector being tested for linearity; and a spectrum analyzer being responsive to the frequency spectrum of an output of the detector, wherein the spectrum analyzer generates harmonics of the modulated RF signal being applied to the detector, and wherein a relationship corresponding to a ratio of power levels of the first and second harmonics of the modulated RF signal is indicative of the linearity of the detector.

2. The system according to claim 1 wherein the first frequency generated by the first oscillator is $f_o$ and the second frequency generated by the second oscillator is $f_o+f_m$ and wherein. $f_o$ and $f_o+f_m$ are nearly identical, and wherein the combination of $f_o$ and $f_o+f_m$ includes a beat frequency $f_m$, and wherein the first and second oscillators are very stable oscillating sources.

3. The system according to claim 1 wherein the first frequency generated by the first oscillator is $f_o$ and the second frequency generated by the second oscillator is $f_m$, and wherein the second frequency is an audio frequency and wherein the combination of $f_o$ and $f_m$ generates a modulated RF signal having a beat frequency $f_m$.

4. The system according to claim 1 wherein the linearity of the detector is determined by the ratio of the power levels of the first and second harmonics of a beat frequency $f_m$ of the modulated RF signal.

5. The system according to claim 4 wherein the ratio of the power levels of the first and second harmonics is determined by:

$B_2/B_1 = (3/4)A_4P_0$ where, $B_1$ is the power level of the first harmonic given by $B_1 = P_o + 3A_4P_o^2$;

$B_2$ is the power level of the second harmonic given by $B_2 = (3/4)A_4P_0$;

$P_0$ is the average RF power being applied to the detector; and $A_4$ is a measure of the detector nonlinearity.

6. The system according to claim 1 wherein the modulated RF signal is applied to an attenuator so as to vary the power of the modulated RF signal being applied to the detector.

7. The system according to claim 1 wherein the first and second oscillators are isolated from the combining means by a set of isolators.

8. The system according to claim 1 wherein the modulated RF signal is applied to a power meter for determining the power of the RF signal being applied to the detector.

9. The system according to claim 1 wherein the output of the detector is applied to a video amplifier prior to being applied to the spectrum analyzer.

10. The system according to claim 1 wherein an output frequency reference signal is applied from the spectrum analyzer to each of the first and second oscillators.

11. The system according to claim 1 wherein the detector is a diode detector intended to be associated with a microwave radiometer to detect microwave frequencies.

12. The system according to claim 11 wherein the microwave radiometer is associated with a tropical rain fall measuring mission microwave imager.

13. A method for testing the linearity of a detector that produces a DC output voltage proportional to an RF power input signal, said method comprising the steps of:

generating a first RF signal;

generating a second RF signal that is different from said first RF signal;

combining the first RF signal with the second RF signal so as to generate a modulated RF signal;

applying the modulated RF signal to the detector being tested for linearity so as to generate an output signal of the detector indicative of the modulated RF signal; and analyzing the spectrum of the output signal of the detector so as to determine harmonics of the modulated RF signal, wherein a relationship corresponding to a ratio of power levels of the first and second harmonics of the modulated RF signal is indicative of the linearity of the detector.

14. The method according to claim 13 wherein the step of generating a first RF signal generates a first RF signal having a frequency of $f_o$ and the step of generating a second RF signal generates a second RF signal having a frequency of $f_o+f_m$ such that $f_o$ and $f_o+f_m$ are nearly identical, and wherein the step of combining the first and second RF signals generates a modulated RF signal having a beat frequency $f_m$.

15. The method according to claim 13 wherein the step of generating a first RF signal generates a first RF signal having a frequency $f_o$ and the step of generating the second RF signal generates a second RF signal having a frequency $f_m$, and wherein the step of combining the first and second RF signals generates a modulated RF signal having a beat frequency $f_m$.

16. The method according to claim 13 wherein the step of analyzing the spectrum of the output signal of the detector includes determining the power level of the first and second harmonics of a beat frequency $f_m$ of the modulated RF signal.

17. The method according to claim 16 wherein the step of analyzing the spectrum of the output signal of the detector includes analyzing the first and second harmonics of the beat frequency to determine $B_2/B_1$ where:

$$B_2/B_1 = (3/4)A_4P_0,$$

and where, $B_1$ is the power level of the first harmonic given by $B_1 = P_0 + 3A_4P_0^2$;

$B_2$ is the power level of the second harmonics given by $B_2 = (3/4)A_4P_0$;

$P_0$ is the average RF power being applied to the detector; and $A_4$ is a measure of the detector nonlinearity.

18. A system for testing the linearity of a detector, said system comprising:

a first oscillator that generates a first frequency;

a second oscillator that generates a second frequency;

combining means for combining the first frequency with the second frequency so as to generate a modulated RF signal;

means for applying the modulated RF signal to the detector being tested for linearity; and a spectrum analyzer being responsive to the frequency spectrum of an output of the detector, wherein the spectrum analyzer generates harmonics of the modulated RF signal being applied to the detector, and wherein a relationship of the harmonics is indicative of the linearity of the detector, and wherein an output frequency reference signal from the spectrum analyzer is applied to each of the first and second oscillators.

19. The system according to claim 18 wherein the detector is a diode detector intended to be associated with a microwave radiometer to detect microwave frequencies.

20. The system according to claim 19 wherein the microwave radiometer is associated with a tropical rain fall measuring mission microwave imager.

* * * * *